United States Patent [19]

Mamada

[11] Patent Number: 5,022,619
[45] Date of Patent: Jun. 11, 1991

[54] POSITIONING DEVICE OF TABLE FOR SEMICONDUCTOR WAFERS

[75] Inventor: Sakae Mamada, Komae, Japan

[73] Assignee: Tokyo Aircraft Instrument Co., Ltd., Komae, Japan

[21] Appl. No.: 431,171

[22] Filed: Oct. 26, 1989

[30] Foreign Application Priority Data

Dec. 9, 1988 [JP] Japan ............................ 63-160567[U]
Dec. 9, 1988 [JP] Japan ............................ 63-160568[U]
Dec. 9, 1988 [JP] Japan ................................ 63-312483

[51] Int. Cl.⁵ .......................................... F16M 11/04
[52] U.S. Cl. ...................................... 248/178; 269/73; 248/913
[58] Field of Search ................... 108/20, 21, 143; 248/DIG. 13, 912, 178, 179, 183; 269/71, 73, 61

[56] References Cited

U.S. PATENT DOCUMENTS

| | | | |
|---|---|---|---|
| 3,149,810 | 9/1964 | Paruolo | 248/178 X |
| 4,213,721 | 7/1980 | Aldridge, Jr. | 269/73 X |
| 4,392,642 | 7/1983 | Chitayat | 269/73 |
| 4,462,580 | 7/1984 | Nielsen | 269/73 |
| 4,492,356 | 1/1985 | Taniguchi et al. | 248/178 X |
| 4,577,845 | 3/1986 | Kimura et al. | 269/73 |
| 4,610,442 | 9/1986 | Oku et al. | 269/73 |
| 4,757,970 | 7/1988 | Nakazawa et al. | 248/178 X |
| 4,763,886 | 8/1988 | Takei | 269/73 |
| 4,787,800 | 11/1988 | Sone et al. | 269/73 X |
| 4,826,421 | 5/1989 | Asano et al. | 269/73 X |

Primary Examiner—Gary L. Smith
Assistant Examiner—Suzanne L. Dino
Attorney, Agent, or Firm—Spencer & Frank

[57] ABSTRACT

A positioning device for a table on which a semiconductor wafer is moved into an inspection position is described. It comprises a pneumatic stage supporting the table and movable both in the x and y directions, a moving device using wire which moves the stage in the x or y direction, and a fine resolution lifting device which moves or lifts the table vertically.

3 Claims, 3 Drawing Sheets

POSITIONING DEVICE OF TABLE FOR SEMICONDUCTOR WAFERS

BACKGROUND OF THE INVENTION

1. Field of the Invention

The present invention relates to a positioning device for a table on which a semiconductor wafer is moved into an inspection position.

2. Background Information

An X·Y wafer stage or X·Y stage has been known, and such a stage moves an inspection area, which supports a wafer, for measuring extremely small displacements in a pattern formed on a semiconductor wafer.

Conventionally, X·Y wafer stages use an orthogonal structure of X and Y axes crossed by means of a ball screw, etc. This arrangement has a two-stage structure and its size is therefore large.

FIG. 1(A) is a schematic view for explaining the problems in such a conventional X·Y stage.

In this example, assume that a guide GF is moved perpendicular, that is, in the y direction to the planar of the figure, while being guided at its both ends. A stage T of $W_1$ in weight is supported and guided by the guide GF, while being movable to right and left (in the x direction). The weight of the stage T is directly applied onto the guide GF, and therefore a certain amount of sagging occurs and for this reason, smooth and precise movement can not be expected.

Depending on the position of the stage T with respect to the guide GF, the load at the ends of the guide GF changes, and also the amount of sagging changes. There is also the problem that depending on the position of the stage T, the height of the stage T changes.

In order to observe the condition of the wafer surface supported by the stage T using a microscope, etc., if the height of the stage T differs, the focus must be adjusted.

As a mechanism for converting rotational motion into rectilinear motion in order to move an X·Y wafer stage or X·Y plotter, etc., a so-called ball screw type mechanism is known, in which the X·Y wafer stage, etc., which is rectilinearly guided and connected to a screw, is driven by rotating the screw. A moving mechanism using a wire is also known.

A conventional wire type moving mechanism is explained here together with the problem associated with it.

FIGS. 2(A) and 2(B) are schematic views for explaining the principle of operation of the conventional wire type moving mechanism. A wire 101 is passed around a pulley 111 and an idle pulley 104. Between the pulleys, the wire 101 is connected with a stage 109, and when the pulley 111 is rotated by a motor 108, the wire 101 is moved to thereby move the stage 109 along with the wire 101.

In order to avoid any slip between the pulley 111 and the wire 101, a certain tension is applied to the wire 101 and also the wire is wound around the pulley 111 several times.

As has been well known, by the rotation of the pulley 111, the wire 101 shifts a distance equal to a diameter of the wire 101 towards the side being taken up. The length of the pulley 111 is designed to include this shift.

This results in the displacement by the stage of an angle $\theta$ between the both ends. While being moved, this axial movement of the wire 101 causes a displacement of an object or expansion of a wire 101, and as the result precise moving is not expected.

For this reason, the conventional devices have been used only when some differences in the rotational number and the moving are allowed.

An inspection of a pattern formed on a wafer surface is generally made by means of an optical microscope. Adjustment of the height of a stage of the auto-focusing mechanism in the optical microscope has been made by means of a fine resolution lifting mechanism.

In order to control the height of the stage of the optical microscope using a pulse motor, etc. for adjusting the focusing, a fine resolution lifting mechanism of a stage is required.

Fine resolution lifting using a beam requires a beam having a large beam ratio.

But, for an inspection machine for semiconductor wafers, it is desirable that the entire size of the machine is made as small as possible.

SUMMARY OF THE INVENTION

An object of the present invention is to provide a positioning device of a stage for a semiconductor wafer, which can solve the problems seen in the conventional positioning devices as mentioned above.

Another object of the present invention is to provide a pneumatic table in the positioning device for a stage of a semiconductor wafer, which can lift a movable portion of a wafer stage, thereby lowering the entire height of the stage and moving it smoothly and precisely.

A further object of the present invention is to provide a moving device of the type using a wire for positioning undesired stage for a semiconductor wafer, which can avoid a displacement while moving the stage from the drawn out side of the wire to its taken-up side.

A still further object of the present invention is to provide a fine resolution device for vertically moving the table under an optical microscope for inspecting a semiconductor wafer, which is small in size but has extremely fine resolution.

The positioning device for a table on which a semiconductor wafer is disposed at an inspection position according to the present invention comprises a pneumatic stage which supports the table which is movable in the x and y directions, a moving device for moving the table in the x or y directions by using a wire, and a fine resolution lifting device which moves the table vertically.

The positioning device according to this invention comprises a bed plate, a first frame consisting of two guide plates for guiding the stage in the X direction, a second frame having two guide plates and slides which inject air to the guide plates of the first frame from side and the bed plate vertically from above, respectively, and a moving stage having slides which inject air to the guide plates of the second frame from sides and to the bed plate vertically from above, respectively.

The moving device using a wire for positioning of the present invention comprises a slide pulley having a cylindrical body provided with a screw groove, a bearing supporting the slide pulley movably in the axial direction, an idle pulley, a wire passed around the side pulley for plural turns and then passed around the idle pulley, a slide pulley rotation and advance-and-retreat movement guide mechanism provided at a fixed position and coupled with the screw groove of the slide pulley, a stage connected to the wire, and a slide pulley drive mechanism which transmits rotational power to the slide pulley.

The fine resolution lifting device in the positioning device of the present invention comprises a moving stand supported and movable vertically with respect to a base; a beam supported at a supporting point on the base, supporting at its shorter portion a part of the moving stand, supporting at its longer portion a rod mounted on the moving stand, and vertically movable with respect to the base; a lead screw supported rotatably and advancingly-and-retreatably movable with respect to the moving stand and connected at its lower end with the rod; a motor provided on the moving stand; and a reduction gear train which reduces the rotation of the motor and transmits the reduction to the lead screw; so that the moving stand may be precisely lifted by rotation of the motor.

DETAILED DESCRIPTION OF THE PREFERRED EMBODIMENTS

Figure 1A:
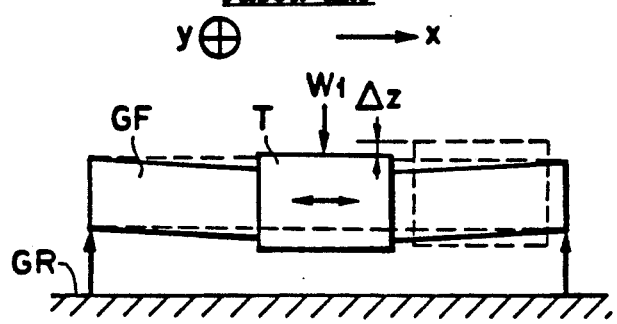
FIG. 1(A) is a schematic view for explaining the structure and principle of a conventional X·Y wafer stage.

Further detailed explanation of the present invention is made with reference to the attached drawings.

First, the structure and the relationship of the positioning device for a semiconductor wafer will be explained in simplified terms using FIGS. 3, 5 and 6.

On a surface such as a glass bed 1 (of FIG. 3, which shows a pneumatic stage for an X·Y wafer stage according to the present invention) a frame I of Y axis guide plates 20, 20 is provided. With respect to the Y axis guide plates 20, 20 a Y stage, or second frame II formed of X axis guide plates 10, 10 and support frame plates 15, 15 is floated and guided.

With respect to the X axis guide plates 10, 10, an X stage formed of X axis holding pads 11, 11 and X axis raising or floating pads is floated and guided. The X stage is made integral with a Z $\theta$ stage 3, and the Z $\theta$ stage 3 supports a wafer table 2 movably in the vertical and rotational directions.

The Y stage II when moved in the y direction is moved along the Y axis guide plates 20, 20 by a moving device using a wire. An idle pulley 104 of the wire using type moving device (shown in FIG. 5, which is a schematic view of an embodiment of the wire using type moving device) is provided to one of support frames 25 and a slide pulley 103 is provided to the other of the frames 25. The stage 109 in FIG. 5 is a moving stage III of the wafer table 2 and the Z $\theta$ stage 3.

The X stage or the Z $\theta$ stage 3 is moved in the x direction along the X axis guide plates 10, 10 by another wire-using moving device. In this case, the slide pulley 103 is provided to one of the support frame plates 15 and the idle pulley 104 is provided to the other plate 15.

Figure 3:
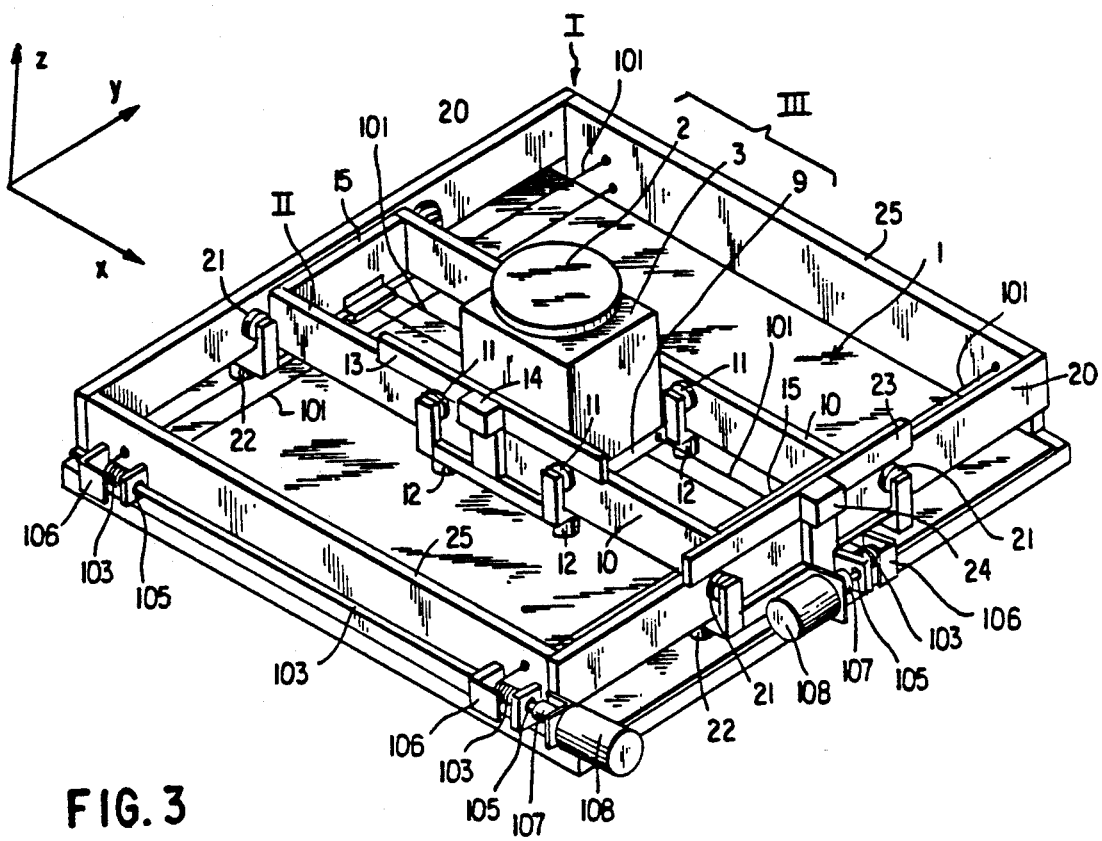
FIG. 3 is a perspective view of an embodiment of a pneumatic table of a positioning device according to the present invention for raising or floating a stage on which a semicondutor wafer is mounted at an inspection position.

The wafer table 202 (of FIG. 6 which is a schematic view of an embodiment of a fine resolution lifting mechanism in the positioning device according to the present invention) can be finely moved with respect to the X stage or Z $\theta$ stage 3 (in FIG. 3). The rotation of the wafer table 2 is carried out by conventional methods. Since the rotation per se is not a problem solved by of the present invention, such is not shown nor explained in the drawings and specification.

Now the embodiment of a pneumatic stage for an X·Y wafer stage shown in FIG. 3 is explained. The device of the present embodiment is disposed and operated on the glass bed 1. On the glass bed 1 is formed an integral fixing frame I consisting of a pair of the Y axis guide plates 20, 20 and a pair of the support frame plates 25, 25 supporting the Y axis guide plates 20, 20.

Within the frame I, these is provided a moving frame II or the Y stage consisting integrally of a pair of X axis guide plates 10, 10 supported with the support frame plates 15, 15. The moving frame II is movable in the y direction within the fixing frame I.

The air injection slide, which injects an air from sides in the moving frame II, includes four pairs of Y axis holding pads 21, 21 against the support frame plates 15, 15. Two pairs of the Y axis holding pads 21 are provided each for the Y axis guide plates 20, and each pair are disposed as to put the guide plates therebetween.

For each of the Y axis holding pads 21, a Y axis raising or floating pad 22 is provided for raising the moving frame II from the bed 1.

A moving stage III consists of the wafer table 2, the Z $\theta$ stage 3 supporting the wafer table 2 and finely adjusting the height and the position of the table 2 in the rotational directions; and a Z $\theta$ stage base 9 supporting the stage 3. The moving stage III is mounted movably in the x direction within the moving frame II. The wafer table 2 has a vacuum sucking face which can suck and fix an object under the vacuum.

To the Z $\theta$ stage base 9 of the moving stage III are provided a pair of the X axis holding pads 11, 11 and four pairs of air injection slides.

Figure 4:
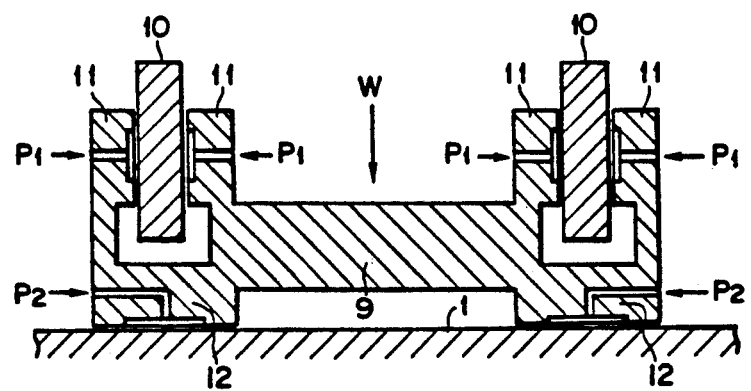
FIG. 4 is a sectional view for showing the structure of air injection slides injecting an air from sides and from above in the embodiment of the pneumatic stage shown in FIG. 3.

Two pairs of the axis holding pads 11, 11 are provided for each of the X axis guide plates 10, while each pair are disposed so as to put the X axis guide plate 10 therebetween. To the X axis holding pads 11, 11 is supplied a proper pressure $P_1$ from a pressure generating apparatus (not shown), as shown in FIG. 4. FIG. 4 is a sectional view for showing the structure of the air injection slides injecting an air from sides and from above, respectively of the embodiment of the above-mentioned pneumatic table.

To each of the X holding pads 11, 11, the X axis raising pad 12 for raising the moving stage III from glass bed 1, and to the X axis raising pad 12, an adequate pressure $P_2$ is applied from a pressure generating apparatus (not shown).

To the Y axis holding pads 21 and the Y axis raising pads 22 of the air injection slide of the moving frame II, adequate pressures are respectively applied from a pressure generating apparatus (not shown).

Figure 5:
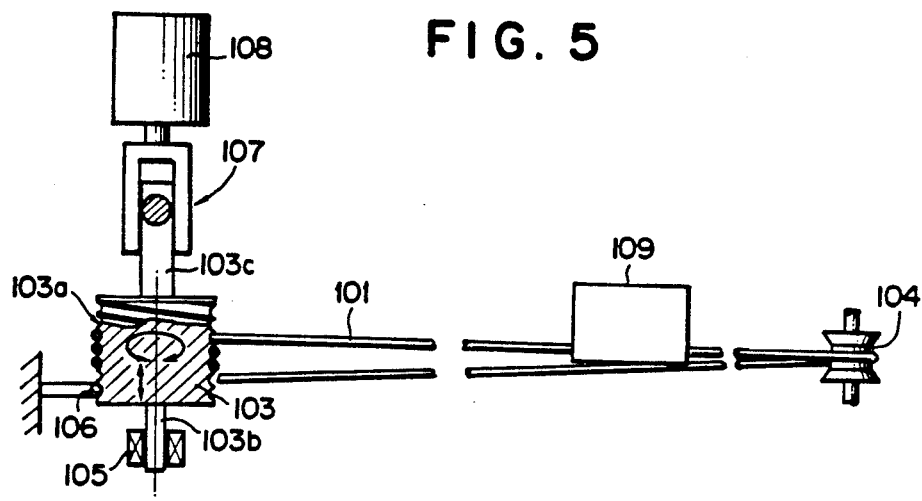
FIG. 5 is a schematic view of an embodiment of a moving device using a wire in the positioning device according to the present invention.

The moving stage III may be moved to a desired position by means of a traction driving device, shown in FIG. 5, along the X axis guide plate 10 of the moving frame II.

To one of the X axis guide plates 10 there is provided an X axis linear scale 13, and to the Z θ stage base 9 is provided a linear scale head 14, so that the position (of the x coordinate) of the moving stage III with respect to the moving frame II can be read.

The moving frame II may be moved by a traction driving device, to a desired position along the Y axis guide plate 20 of the fixed frame I.

To one of the Y axis guide plates 20 is mounted a Y axis linear scale 23 and to the fixed frame I is mounted a linear scale head 24, so as to be able to read the relative position (of the y coordinate) of the moving frame II with respect to the fixed frame I.

Figure 1B:
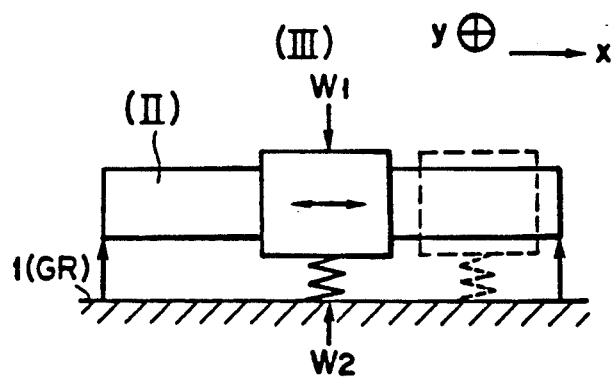
FIG. 1(B) is a schematic view for explaining the structure and principle of a pneumatic X·Y moving stage according to the present invention.
Figure 2A:
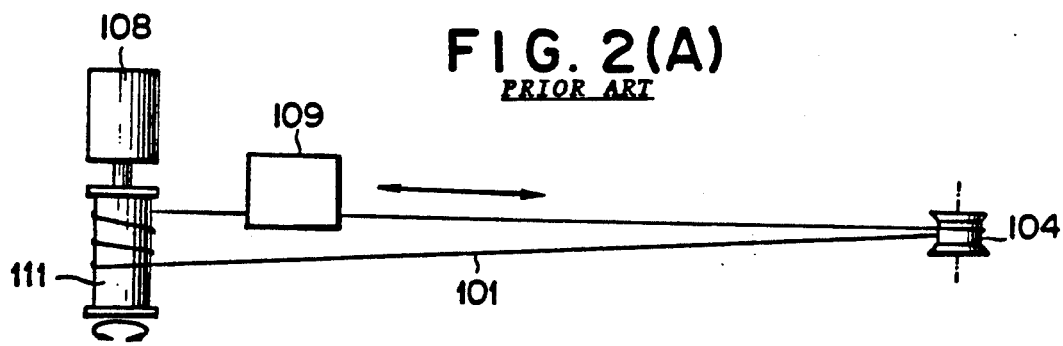
FIGS. 2(A) and 2(B) are schematic views for explaining the operational principle of a conventional moving mechanism using a wire.
Figure 2B:
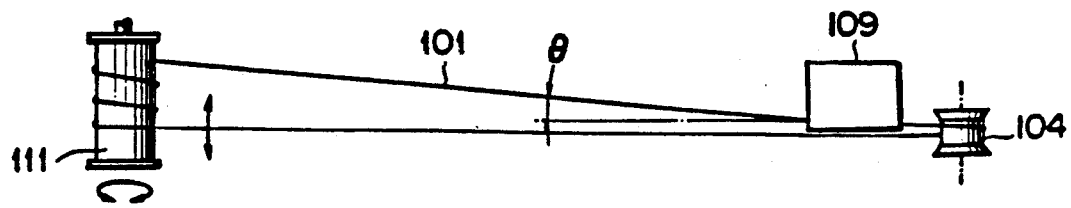

The relation of the fixed frame I, the moving frame II and the moving stage III is explained with reference to FIG. 1(B).

The moving frame II of the pneumatic stage according to the present invention is raised with respect to the glass bed or ground 1 (GR) by the air injection flat slides of the weight balance type provided at both ends of the frame II. On the other hand, to the fixed frame I, the air injection slides are faced.

The moving stage III does not influence either the moving frame II or the fixed frame I at any position, while it is raised.

It will be understood that the pneumatic stage according to the present invention has the moving stage being raised and made movable to any position in the two directions crossing with each other while being non-contacting with the guided means.

The present invention may therefore be utilized for an X·Y moving table in which an object to be inspected is brought to a desired position in two-dimensional directions.

In the conventional X·Y table, the X and Y axes are crossed with each other and it is of the two-stage structure. Therefore the height of the table is very high. According to the present invention the moving stage is directly supported and raised by the bed plate, and it does not necessitate making the device tall.

In the conventional X·Y moving table, the weight of the stage is directly applied to the guide, and so a depression or sagging is seen and there is the possibility of being unable to smoothly and precisely move it. Such drawbacks are fully overcome by the above mentioned embodiment of the present invention.

Against the guides, the guided portion is supported by using the air injection type slide system.

Therefore, no friction of the movable portion is generated and smooth and precise movement is possible. Thus, very precise positioning is made possible.

As explained above, in the pneumatic moving table according to the present invention there is little error in the height of table and the smooth and precise movement is possible. The table of the present invention may therefore be used in the measuring device for an extremely small displacement of the position of the semiconductor wafers, such as while the surfaces thereof are observed with a microscope of which an explanantion has been given above.

In FIG. 5, a slide pulley 103 has a cylindrical body provided with a screwed groove. The slide pulley 103 consists of a cylindrical body, a shaft 103b to be coupled with a stroke bearing 105 and a spline shaft portion 103c forming a spline coupling. As explained above, a screw groove 103a is formed around a cylindrical body of the slide pulley 103. A pitch of the groove 103a corresponds to one pitch of movement or feed, of which an explanation will be made later. The stroke bearing 105 forms a bearing supporting the slide pulley 103 movably in the axial direction.

A wire 101 is passed for plural turns around the slide pulley 103 along the screw groove 103a thereof and then around an idle pulley 104 which is rotatably supported in a fixed position.

The spline shaft portion 103c is connected with a motor 108 by means of a spline coupling 107 and rotational power is applied to it from the motor 108.

A ball bearing 106 is connected at its fixed position with the screw groove 103a and forms a guide for the slide pulley 103 for its rotation and also advance and retreat movement thereof.

A stage 109 is guided by an advance and retreat movement guide mechanism (not shown) and is connected with the wire 101. The stage 109 corresponds to the wafer table 2 and the Zθ stage 3 of FIG. 3.

The device of the present invention is constructed as explained above, and by the rotation of the motor 108 in the forward and reverse directions, the wire 101 may be moved to further move the stage 109.

By the rotation of the motor 108, the slide pulley 103 is rotated. The slide pulley 103 is moved an amount corresponding to the rotation, that is, for the corresponding amount of displacement of the wound wire 101. Thus, the connected left-most position of the wire 101 does not change with respect to the fixed position of the ball bearing 106. As a result, the tension of the wire does not change.

As fully explained, a moving device using a wire according to the present invention comprises the slide pulley, the bearing supporting the slide pulley movably in its axial direction, the idle pulley, the wire passed between the slide pulley and the idle pulley, the rotation and advance and retreat movement guide mechanism of the slide pulley, and the slide pulley driving mechanism.

The structure of the wire using moving device of the present invention is very simple and more inexpensive than the conventional ball screw mechanism.

The object to be driven is moved via the wire, and so oscillation from the driving source, etc., if any, may be attenuated before reaching the object. The conventional ball screw type mechanism has had a problem that the object to be driven may be affected by such an oscillation.

The slide pulley moves simulataneously with the rotation thereof as explained above, and there will be no change in the movement and the tension of the wire, thus enabling precise movement.

Figure 6:
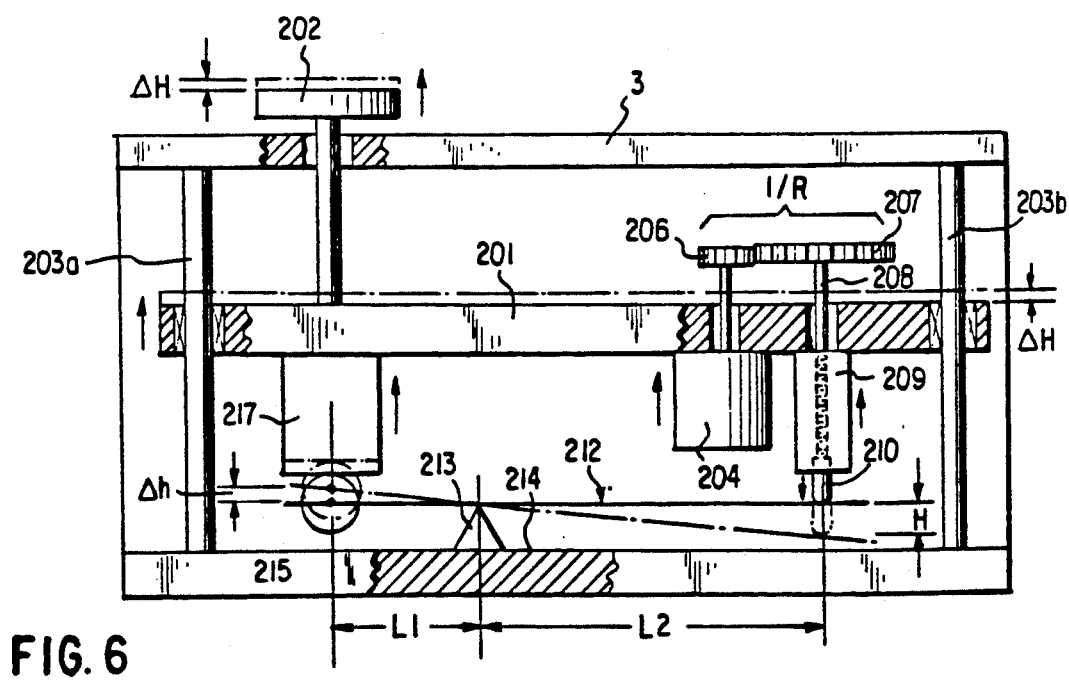
FIG. 6 is a schematic view of an embodiment of a finely lift mechanism of the positioning device according to the present invention.

In FIG. 6, a beam 212 is supported on a base 214 at a supporting point 213. To the left end of the beam 212 a bearing 215 is mounted. A moving stand 201 is movable parallel to with the base 214 and is guided to be movable vertcially with respect to the base 214 by moving stand guides 203a and 203b.

The moving stand 201 is supported on the bearing 215 at the left end of the beam 212 through a bearing bracket 217 protruding downwardly from the stand 201. The stand 201 is supported at the right end of the beam 212 contacting a rod 210 provided at a lower end of a lead screw 208 integrally connected with a cylindrical member 209 having a central female screw provided at the right hand of the stand 201. The rod 210 contacts with the right end of the beam 212. A pulse motor 204 is fixed to the moving stand 201 and to its output shaft a gear 206 is connected.

The lead screw 208 connected with the cylindrical member 209 fixed to the moving stand 201 forms a shaft for a gear 207. The lower end of the screw 208 it is mounted the rod 210.

The gears 206 and 207 form a reduction gear system (1/R). The rotation of the motor 204 is reduced to 1/R rotations, which is transmitted to the lead screw 208.

Assume that the pulse motor 204 is rotated for a step angle of α degrees. The rotation is then transmitted through the reduction gear system of the gears 206 and 207 to the lead screw 208 thereby lowering by the rod 210 the right end of the beam 212 a distance H with respect to the moving stand 201.

The beam 212 is rotated about the supporting point 213. As a result, the left end thereof moves upward for a distance Δh, and accordingly the stand 201 rises by the bearing 215 ΔH.

The stage 202 mounted on the stand 201 is also rasied ΔH. The combination of the stand 201 and the stage 202 corresponds to the wafer table 2 shown in the embodiment of FIG. 3 and the base 214 corresponds to the Zθ stage 3.

If the beam length between the point 213 and the bearing 215 is given by $L_1$, the beam length between the point 213 and a point where the rod 210 touches is given by $L_2$, and lead of the cylindrical member 209 is given by l, the following equations are obtained:

$$H=[(\alpha \times l)/360] \times (1/R)$$

$$\Delta h = (L_1/L_2)H$$

$$\Delta H = (H - \Delta h)(L_1/L_2).$$

From these, the following equation is obtained:

$$\Delta H = H[1-(L_1/L_2)](L_1/L_2).$$

As fully described above, in the fine resolution lifting mechanism of the positioning device according to the present invention the moving stand is vertically supported with respect to the base.

The stand is supported by the beam which is supported to the base at a supporting point. The beam is driven by a motor provided to the moving stand through the reduction gears. Thus the stand may be moved vertically for an extremely small amount by rotation of the motor.

It is not necessary to use a long beam and a large beam ratio. The device therefore can be made very compact in size. Further, the moving stand or stage may be driven with high resolution.

In the embodiment of FIG. 6, the fine lifting with a high resolution of less than 0.1 μm can he realized.

The Zθ stage 3 shown in FIG. 3 rotates the wafer table 2 and also moves the table 2 vertically or in the z direction. The wafer table 2 of FIG. 3 represents the stage 202 of FIG. 6. The stage 202 is moved with respect to the base 214 in the z direction, or in the H direction. The base 214 is included in FIG. 3 within the Zθ stage 3. And the base 214 supports within the Zθ stage 3, the moving stand 201, in other words the stage 202, and rotates around a central axis of the stage 202.

What is claimed is:

1. A positioning device for a table movable in three mutually orthogonal directions, on which a semiconductor wafer is disposed at an inspection position comprising:
    pneumeatic stage supporting means for supporting the table, said stage supporting means being movable in a first and second of the three directions;
    wire moving means for moving the stage supporting means in the first and second direction; and
    fine resolution lifting means for moving the table in a third of the three directions;
    wherein said pneumatic stage supporting means comprises:
        a bed plate;
        a first frame including two guide plates for guiding the pneumatic stage supporting means in the first direction;
        a second frame having two guide plates and slides which inject air against the guide plates of the first frame from the sides and against the bed plate vertically from above, respectively; and
        a moving stage having slides which inject air against the guide plates of the second frame from the sides and against the bed plate vertically from above, respectively.

2. A positioning device according to claim 1, wherein the wire moving means for moving the stage supporting means comprises:
    a slide pulley having a cylindrical body provided with a screw groove;
    a bearing supporting the slide pulley movably in the axial direction;
    an idle pulley; p1 a wire passed around the slide pulley for plural turns and then passed around the idle pulley;
    a slide pulley rotation and advance-and-retreat movement guide mechanism, provided at a fixed position and coupled with the screw groove of the slide pulley;
    said moving stage being connected with the wire; and
    a slide pulley drive mechanism which rotates the slide pulley.

3. A positioning device according to claim 1, wherein the fine resolution lifting means comprises:
    a moving stand movably support in the third direction with respect to a base;
    a beam, having a longer and a shorter portion, supported at a supporting point on the base, its shorter portion supporting a part of the moving stand and its longer portion supporting a rod mounted to the moving stand and movable in the third direction with respect to the base;
    a lead screw supported rotatably and advancingly-and-retreatably movable with respect to the moving stand and connected at its lower end to the rod;
    a motor provided on the moving stand; and
    a reduction gear train connected to the motor and the lead screw which reduces the rotation of the motor and transmits the reduced rotation to the lead screw;
    whereby the moving stand may be finely moved by the rotation of the motor.

* * * * *